United States Patent [19]
Lowe et al.

[11] 3,949,324
[45] Apr. 6, 1976

[54] SURFACE WAVE DEVICE ANGLE MODULATOR

[75] Inventors: Benjamin L. Lowe, Huntsville, Ala.; Jerry D. Holmes, Dallas, Tex.

[73] Assignee: Texas Instruments Incorporated, Dallas, Tex.

[22] Filed: Nov. 11, 1974

[21] Appl. No.: 522,554

[52] U.S. Cl. .............. 332/26; 325/449; 331/107 A; 333/30 R
[51] Int. Cl.² ............................................. H03C 3/28
[58] Field of Search ............ 332/26, 16 R, 161, 2 X; 333/30 R, 72; 325/446, 459, 460, 449; 358/23–25; 331/107 A

[56] References Cited
UNITED STATES PATENTS

| | | | |
|---|---|---|---|
| 3,582,540 | 6/1971 | Adler et al. | 331/107 A X |
| 3,750,027 | 7/1973 | Hartmann | 333/72 X |
| 3,869,682 | 3/1975 | Heeks et al. | 332/26 X |
| 3,875,517 | 4/1975 | Dilley | 331/107 A X |
| 3,878,477 | 4/1975 | Dias et al. | 331/107 A X |

OTHER PUBLICATIONS
Crabb et al., "Surface–Acoustic–Wave Oscillators: Mode Selection and Frequency Modulation," Electronic Letters, 17th May 1973, Vol. 9, No. 10, pp. 195–197.

*Primary Examiner*—John Kominski
*Attorney, Agent, or Firm*—Harold Levine; James T. Comfort; William E. Hiller

[57] ABSTRACT

A system for generating angular modulation comprising a balanced modulator and an adding circuit to which a surface wave device quadrature oscillator applies two signals at the carrier frequency differing 90° in phase, such phase difference being accurately maintained independent of aging and variations in operating temperatures. More particularly, an information signal is applied to one input of the balanced modulator, the output of which is applied to the adding circuit. The surface wave device oscillator completes the system by applying an in-phase carrier frequency to a second input of the balanced modulator and a carrier frequency shifted 90° in phase to a second input of the adding circuit. Angular modulation is thus produced at the output of the adding circuit.

14 Claims, 3 Drawing Figures

SURFACE WAVE DEVICE ANGLE MODULATOR

FIELD OF THE INVENTION

This invention relates to radio frequency signal processing, and more particularly to the generation and application of local oscillator signals which are separated in phase by a fixed angle of 90°, the phase being accurately maintained independent of aging and temperature variations.

PRIOR ART

Whenever an alternating voltage may be expressed as $$e = A \cos (\Omega t + \theta),$$

the instantaneous voltage magnitude may be represented by a rotating phasor having an angular velocity defined as $$\Omega = d\theta/dt, \qquad (1)$$

from which $$\theta(t) = \int \Omega(t) \, dt + \theta_o(t) \qquad (2)$$

where the constant of integration $\theta_o$ is a phase angle. It is then possible to define the alternating voltage as $$e = A \cos \left[ \int \Omega dt + \theta_o \right]. \qquad (3)$$

Variation of the amplitude A with time provides amplitude modulation (AM) wherein the angular velocity $\Omega$ is a constant $\Omega_o$ and $\theta_o$ is constant.

Variation of the angle $\theta$ with time provides angle modulation which may be viewed in one of two ways. If $\int \Omega dt$ is varied with time, frequency modulation (FM) is indicated. However, if the phase angle $\theta_o$ is varied with time, phase modulation (PM) is indicated.

In the processing of radio frequency signals in angular modulation systems, there is encountered the need for two signals of the same frequency separated in phase by 90°. In prior systems where in-phase and quadrature phase signals have been required, the generation thereof has been accomplished but utilizing a single oscillator with one output applied directly and a second output being passed through a 90° phase shifter. The stability and selectivity of such in-phase and quadrature phase signal systems, generally referred to herein as I & Q signal processors, are susceptible to age deterioration and wide temperature variations. The present invention provides a system wherein a precise 90° phase shift is provided which is independent of aging or temperature variations.

SUMMARY OF THE INVENTION

The present invention is directed to a simple angle modulation system having high stability and comprising a balanced modulator, an adding circuit, and a surface wave device quadrature oscillator. More particularly, phase modulation of an RF information signal is accomplished by applying the information signal to one input of the balanced modulator, the second input of which is supplied by a first output of the surface wave device. The output of the balanced modulator and a second output of the surface wave device oscillator differing 90° in phase from the first output thereof then are applied to an adding circuit to produce a phase modulated signal.

In order to provide a frequency modulated signal, the information signal is merely integrated prior to application as one input to the balanced modulator.

In one aspect of the present invention, there is provided an inphase and quadrature phase signal (I & Q) module comprising a surface wave device (SWD) and an amplifier connected in a feedback loop, where the output of the amplifier supplies an input to the SWD and an output transducer of the SWD supplies an input to the amplifier. A second amplifier is connected to a second output transducer located on the SWD such that the input to the second amplifier differs precisely 90° in phase from the SWD input to the first amplifier. Because of the characteristics of the SWD, the 90° phase difference remains substantially constant independent of aging or variation in temperature.

DESCRIPTION OF THE DRAWINGS

The novel features believed characteristic of the invention are set forth in the appended claims. The invention itself, however, as well as further objects and advantages thereof, will best be understood by reference to the following detailed description of an illustrative embodiment taken in conjunction with the accompanying drawings, in which:

DESCRIPTION OF PREFERRED EMBODIMENTS

Angular modulation arises when a signal intelligence function $f(t)$ of a carrier $e(t)$ is used to change either the phase angle $\theta(t)$ or the time derivative of the phase angle, the amplitude of the carrier remaining constant.

In producing phase modulation (PM), it can be shown that where the carrier signal may be represented by $$e(t) = A_o \cos \theta(t), \qquad (4)$$

a phase modulated signal expressed as $$y(t) = A_o \cos [\Omega_o t + k_1 f(t)] \qquad (5)$$

may be produced, where $$\theta(t) = \Omega_o t + k_1 f(t). \qquad (6)$$

The factor $\Omega_o$ in equation (6) is the carrier frequency, while the factor $k_1$ is a proportionality constant relating the amount of phase shift per unit change of the intelligence function $f(t)$. Thus, the term $k_1 f(t)$ represents the modulation as a function of time.

The present invention relates to a stable system which provides two signals of identical frequency having an accurately maintained 90° phase difference while operating at very high frequencies up to and in excess of 1.0 GHz.

FIG. 1

Figure 1:
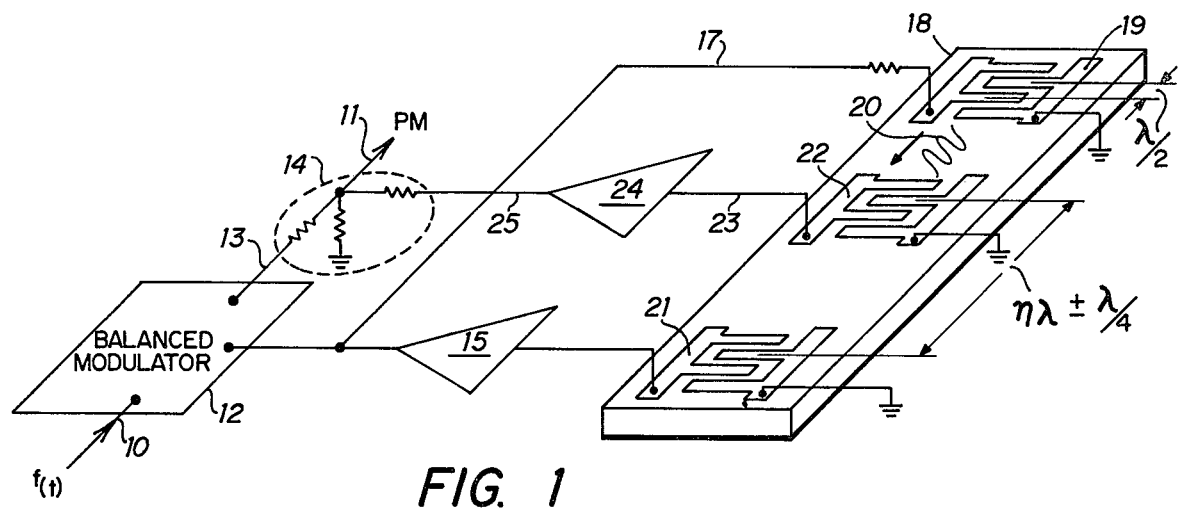
FIG. 1 illustrates a phase modulation system embodying the present invention.

More particularly, as shown in FIG. 1, a phase modulated output signal is provided on a channel 11 from an input signal on channel 10. Channel 10 leads to a balanced modulator 12, the output of which is applied by way of channel 13 to an adding circuit 14 having an output channel 11. A second input to the balanced modulator is provided by the output of an amplifier 15, which provides the carrier signal for the modulator. The output of amplifier 15 is also applied by way of channel 17 to the input of a surface wave device (SWD) 18.

The balanced modulator 12 may be of the type SN56514 or SN76514 manufactured and sold by Texas Instruments, Inc., of Dallas, Texas. The structure and operation of the balanced modulator is described in detail in the handbook, Linear And Interface Circuits Data Book For Design Engineers (Texas Instruments, Inc., 1973), pages 7–47.

The SWD 18 is a passive electroacoustic device that has metallized interdigital transducer elements 19, 21 and 22 on the surface of a piezoelectric substrate such as quartz. The transducers generally are fabricated with standard photolithographic techniques. Such SWDs employ phonon propagation or vibrations in the crystal lattice structure of the substrate as the basic energy-transport mechanism, with most of the acoustic energy confined to a region within about one wavelength of the surface of the substrate.

Thus, when an electrical signal is applied to an input transducer of an SWD device, acoustic energy is generated which may be manipulated and detected on the substrate surface. Such acoustic surface waves propagate with the velocity about five orders of magnitude smaller than the velocity of electromagnetic waves in free space.

The length of an SWD device such as SWD 18 is inversely proportional to signal bandwidth. Electrode width and spacing depends on frequency. In frequency modulation as used in television UHF and VHF systems, wavelengths are so short and bandwidths are sufficiently large that the maximum dimension of SWDs required as in FIG. 1 may be a fraction of an inch. SWD filtersthus allow reduction in size, weight, design and complexity compared with conventional systems for processing like signals.

Continuing with the description of FIG. 1, the application of an RF input signal to transducer 19 causes an acoustic wave 20 to propagate toward transducer 21 where it is detected. The frequency of wave 20 is controlled by the spacing between the interdigital fingers of transducer 19, which in the embodiment herein described are one-half wavelength (½ λ) apart.

Upon wave 20 being detected by transducer 21, a signal is provided to the input of amplifier 15 which is 180° out of phase with the input signal on channel 17. Thus, the amplifier 15 and the SWD 18 form a feedback oscillator loop, the frequency of which is controlled by the physical characteristics of the SWD 18.

In accordance with the present invention, a second transducer 22 is installed on the SWD 18 to produce an output on channel 23 which has a phase lead of 90° over the signal detected by the array 21. More particularly, the spacing in acoustic wavelengths between corresponding fingers of transducers 21 and 22 is $n\lambda \pm \lambda/4$, where $n$ is an integer. With this spacing, there is a phase difference between the outputs of transducers 21 and 22 of 90°. Similarly, the spacing between corresponding fingers of transducers 19 and 21 is $n\lambda \pm \lambda/2$, i.e., to provide a phase difference of 180 degrees.

The signal on channel 23 is applied by way of amplifier 24 to input 25 of the adding circuit 14. In addition, the output of balanced modulator 12 is applied along channel 13 to a second input of circuit 14 to provide a phase modulated output signal on channel 11.

As described in detail in the ITT handbook, Reference Data For Radio Engineers (4th Edition, 1956), pp. 19–534, the side band distribution in an angular modulation system may be expressed as set forth in equation (5) above. It will be apparent from an inspection of the circuit illustrated in FIG. 1 that the output on channel 11 may be expressed as $$y = k_2[\cos \Omega_o t - k_1 f(t) \sin \Omega_o t], \tag{7}$$

where $k_2$ is a proportionality constant. Further, it can be shown that for small phase angle modulation, equation (5) is the equivalent of equation (7). Thus, the phase modulated signal as expressed by equation (5) has been realized by the simple circuit illustrated in FIG. 1, where modulator 12 and adding circuit 14 utilize two signals at the carrier frequency having a 90° phase difference to produce a phase modulated signal.

In operation, an information signal $f(t)$ is applied by way of channel 10 to modulator 12. Assuming a sinusoidal carrier frequency, a $\sin \Omega_o t$ signal is supplied by SWD transducer 21, while a $\cos \Omega_o t$ signal is supplied by SWD transducer 22 Thus, the output of modulator 12 may be expressed as $$-k_1 f(t) \sin \Omega_o t \tag{8}$$

which is applied by way of channel 13 to adding circuit 14 and added to the $\cos \Omega_o t$ signal from the output of amplifier 24. A phase modulated signal is thereby produced along channel 11 as expressed by equation (7) above.

FIG. 2

In frequency modulation (FM), the instantaneous frequency $\Omega(t)$ may be expressed as $$\Omega(t) = \Omega_o t + k_3 f(t), \tag{9}$$

where $k_3$ is the maximum frequency excursion from the carrier frequency. The relationship between $\Omega(t)$ and the $\theta(t)$ of equation (5) above is given by $$\Omega(t) = d\theta(t)/dt, \tag{10}$$

from which $$\theta = \int \Omega(t) dt + \theta_o. \tag{11}$$

Assuming a sinusoidal carrier signal, a frequency modulated signal may be expressed as $$y(t) = A_o \cos [\int \Omega(t) dt + \theta_o], \tag{12}$$

where $A_o$ and $\theta_o$ are constants.

Figure 2:
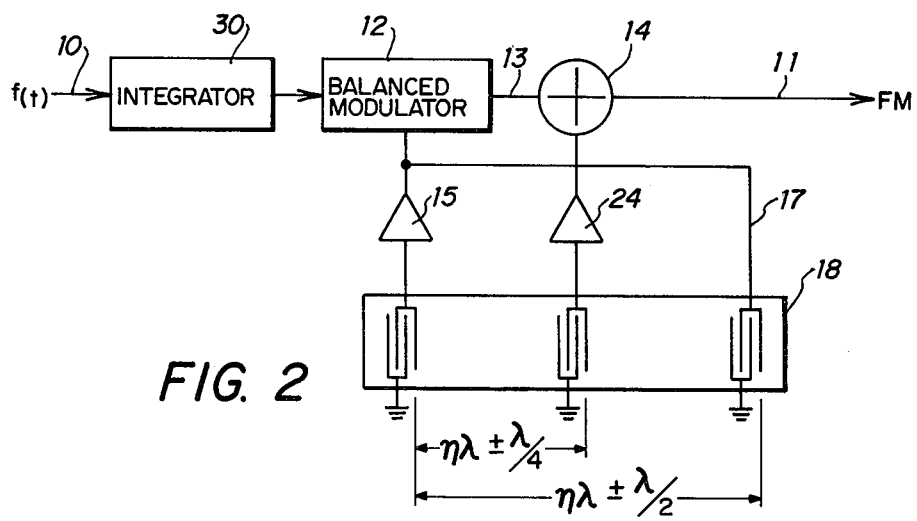
FIG. 2 illustrates a frequency modulation system embodying the present invention.

FIG. 2 illustrates a modification to the system of FIG. 1 in order to provide a frequency modulated output signal on channel 11. In this system, channel 10 is connected to the input of an integrator 30, the output of which is connected to the first input of the balanced modulator 12. Otherwise, the circuit is the same as in the system of FIG. 1. The presence of the integrator 30 provides for utilization of the relatively simple system of FIG. 1 for the more general objective of frequency modulation.

In operation, an information signal $k_3 f(t)$ is applied to integrator 30, the output of which may be expressed as $$\int k_3 f(t)dt + \theta_o. \tag{13}$$

With the SWD transducers tuned as before described, the output of the balanced modulator may be expressed as $$-[\int k_3 f(t)dt + \theta_o] \sin \Omega_o t, \tag{14}$$

which is summed in adding circuit 14 with the $\cos \Omega_o t$ output of amplifier 24 to produce a frequency modulated signal on channel 11 expressed as $$y(t) = k_4[\cos \Omega_o t - (\int k_3 f(t)dt + \theta_o) \sin \Omega_o t]. \tag{15}$$

It can be shown as before described that the equation (15) is the equivalent of equation (12).

FIG. 3

Figure 3:
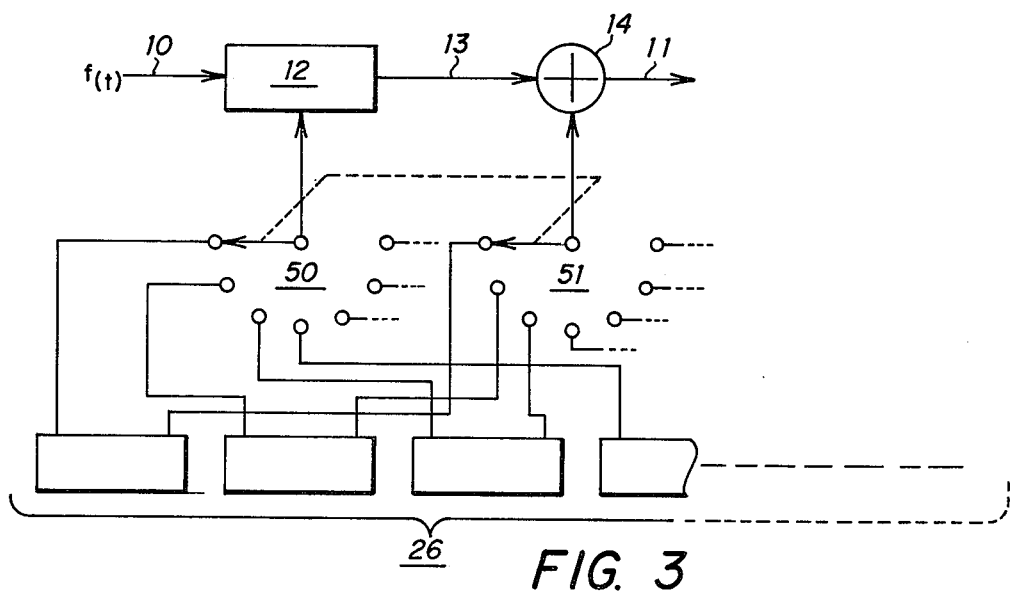
FIG. 3 illustrates a system having plural SWD I & Q modules for channel selection.

In the system of FIGS. 1 and 2, the invention is illustrated as it is employed in familiar angular modulation operations. However, as illustrated in FIG. 3, the invention may be employed in a receiver system where demodulation takes place with a plurality of I & Q modules connected as shown in FIG. 1, each module comprising amplifiers 15 and 24, and SWD 18. The signal on channel 10 may be a voice or video modulation frequency, and the in-phase carrier output from the oscillator loop at amplifier 15 may be at the carrier frequency for a given station channel.

More particularly, each of an array of modules 26 has a first oscillator output connected to a terminal of rotary switch 50, and a second oscillator output shifted 90° in phase from the first output thereof and connected to a terminal of a rotary switch 51. The pole of switch 50 is connected to one input of modulator 12, while the pole of switch 51 is connected to adding circuit 14. The remainder of the system is as illustrated in FIG. 1.

Rotary switches 50 and 51 are ganged so that for a given channel selection, a single module of array 26 is connected to the poles of the switches, with each of the modules having an output frequency suitable for an FM or TV channel to be received.

In accordance with the invention, there is provided a simple and inexpensive angular modulation system comprising an SWD local oscillator providing two carrier frequency signals having a phase difference of 90°, such phase difference being accurately maintained independent of aging and variations in operating temperature.

Having described the invention in connection with certain specific embodiments thereof, it is to be understood that further modifications may now suggest themselves to those skilled in the art and it is intended to cover such modifications as fall within the scope of the appended claims.

What is claimed is:

1. An angular modulation system, which comprises:
  a. a balanced modulator having a first input for receiving an information signal to be modulated;
  b. a local oscillator including surface wave device means having a first carrier signal output which is applied to a second input of said modulator, and having a second carrier signal output shifted 90° in phase from said first carrier signal output; and
  c. adding circuit means having one input for receiving the output signal from said modulator and having a second input for receiving said second carrier signal output for producing a modulated carrier signal as the output therefrom.

2. The combination set forth in claim 1 wherein the information signal is applied directly to said first input of said balanced modulator to produce a phase modulated carrier signal as the output from said adding circuit means.

3. The combination set forth in claim 1 further including an integrator operably connected to said first input of said balanced modulator for receiving and operating on the information signal prior to its reception by said first input of said balanced modulator to produce a frequency modulated carrier signal as the output from said adding circuit means.

4. The combination set forth in claim 1 wherein said surface wave device means comprises a substrate having at least a surface of piezoelectric material, an input transducer and two output transducers, and each of said transducers being formed on the piezoelectric surface of said substrate.

5. The combination set forth in claim 4 wherein said input transducer has interdigital fingers which are spaced apart one-half wavelength of an acoustical signal generated in the piezoelectric material of said substrate.

6. The combination set forth in claim 5 wherein said two output transducers have corresponding interdigital fingers which are spaced apart an integral number of wavelengths plus or minus onequarter wavelength of said acoustical signal.

7. The combination set forth in claim 1 wherein said local oscillator further includes an amplifier connected to said surface wave device means and to said second input of said modulator for receiving said first carrier signal output and applying said first carrier output shifted 180 degrees in phase to both said second input of said balanced modulator and an input transducer included in said surface wave device means.

8. In an angular modulation system, the combination comprising:
  a. a balanced modulator having a first input for receiving an information signal to be modulated;
  b. a local oscillator connected to a second input of said modulator and including an amplifier and a surface wave device means in a feedback loop where the output of said amplifier is connected to said second input of said modulator; and
  c. adding circuit means having one input for receiving the output signal of said modulator and having a second input for receiving an output signal from said surface wave device means differing 90 degrees in phase from the output of said amplifier for producing a modulated carrier signal as the output therefrom.

9. The combination set forth in claim 8 wherein said surface wave device means comprises a substrate having at least a surface of piezoelectric material, and three transducer elements on the piezoelectric surface of said substrate, one of said three transducer elements having metallized interdigital fingers which are spaced apart one-half wavelength of an acoustical signal generated in the piezoelectric material of said substrate, and two of said three transducer elements having corresponding metallized interdigital fingers which are spaced apart an integral number of wavelengths plus or minus one-quarter wavelength of said acoustical signal.

10. The combination set forth in claim 8 wherein said system includes an integrator operably connected to said first input of said balanced modulator for receiving and operating on the information signal prior to its reception by said first input of said balanced modulator to produce a frequency modulated carrier signal as the output from said adding circuit means.

11. A local oscillator providing two signals at the same frequency differing 90° in phase, which comprises:
a surface wave device means comprising a substrate having at least a surface of piezoelectric material, and an input transducer and two output transducers on the piezoelectric surface of said substrate;
said input transducer having metallized interdigital fingers which are spaced apart $\lambda/2$, where $\lambda$ is the wavelength of an acoustical signal generated in the piezoelectric material of said substrate by said input transducer in response to the application of an electrical signal thereto;
said two output transducers being arranged in longitudinal alignment with said input transducer along the same acoustic surface wave propagation path and having corresponding metallized interdigital fingers which are spaced apart an integral number of wavelengths $\pm$ one-quarter wavelength of the acoustical signal; and
an amplifier having an input connected to one of said two output transducers, the output of said amplifier being connected to said input transducer in a feedback loop for providing an electrical signal thereto;
the output of said amplifier also providing one of the two signals differing 90° in phase, and the output of the other of said two output transducers providing the other of said two signals.

12. A local oscillator as set forth in claim 11, further including a second amplifier having an input connected to the other of said two output transducers so as to amplify the output of the other output transducer in providing the other of said two signals.

13. A local oscillator as set forth in claim 11, wherein said two output transducers are disposed on the same side of said input transducer.

14. A signal receiver system, which comprises:
a balanced modulator having a first input for receiving an information signal to be modulated;
an array comprising a plurality of local oscillators, each of said local oscillators including surface wave device means having a first carrier signal output and a second carrier signal output shifted 90° in phase from said first carrier signal output;
adding circuit means having one input for receiving the output signal from said modulator;
said modulator having a second input for selectively receiving the first carrier signal output from one of said plurality of local oscillators and said adding circuit means having a second input for selectively receiving the second carrier signal output from the same one of said plurality of local oscillators; and
switching means having a plurality of switch positions corresponding in number to said plurality of local oscillators for selectively interconnecting the first and second carrier signal outputs from a single one of said plurality of local oscillators to said modulator and said adding circuit means respectively for producing a modulated carrier signal as the output from said adding circuit means indicative of a particular station or channel to be received.

* * * * *